United States Patent [19]

Ames

[11] Patent Number: 4,534,014
[45] Date of Patent: Aug. 6, 1985

[54] MECHANICALLY PROGRAMMABLE READ ONLY MEMORY

[76] Inventor: Oliver C. Ames, Rte. 2, Box 52A, Clear Lake, Wis. 54005

[21] Appl. No.: 505,951

[22] Filed: Jun. 20, 1983

[51] Int. Cl.³ ............................................. G11C 17/00
[52] U.S. Cl. ....................................... 365/100; 365/94
[58] Field of Search ......................... 365/94, 100, 103

[56] References Cited

U.S. PATENT DOCUMENTS 4,162,538 7/1979 Thornburg ..................... 365/103 X

*Primary Examiner*—Joseph A. Popek
*Attorney, Agent, or Firm*—Palmatier, Sturm, Sjoquist & Baker

[57] ABSTRACT

A mechanically programmable read only memory in the form of a card for use with a reading circuit to which the card is applied, an insulating substrate with a multiplicity of resistive coating strips arranged in a pattern on the face of a substrate, a multiplicity of circuit interrupters between corresponding ends of resistive strips and being removable along with any surface media applied thereover; conductor strips laid over the circuit interrupters and intersecting with the resistive strips for electrical connection therewith; additional conductor strips or bus strips applied on the substrate to intersect with the other ends of the resistive strips, all of the conductor strips having ends clustered at one edge of the substrate forming connector contacts for assembly with such reading circuitry; the resistive strips, circuit interrupters, and conductor strips being applied by screen printing technology; the circuit interrupters being formed of scratch off ink or mechanically abradable and removable ink; the conductor strips and resistive coating strips being respectively formed of low and high resistance inks; and a protective coating applied over the substrate and conductor strips, leaving windows for gaining access to the scratch off circuit interrupters.

19 Claims, 7 Drawing Figures

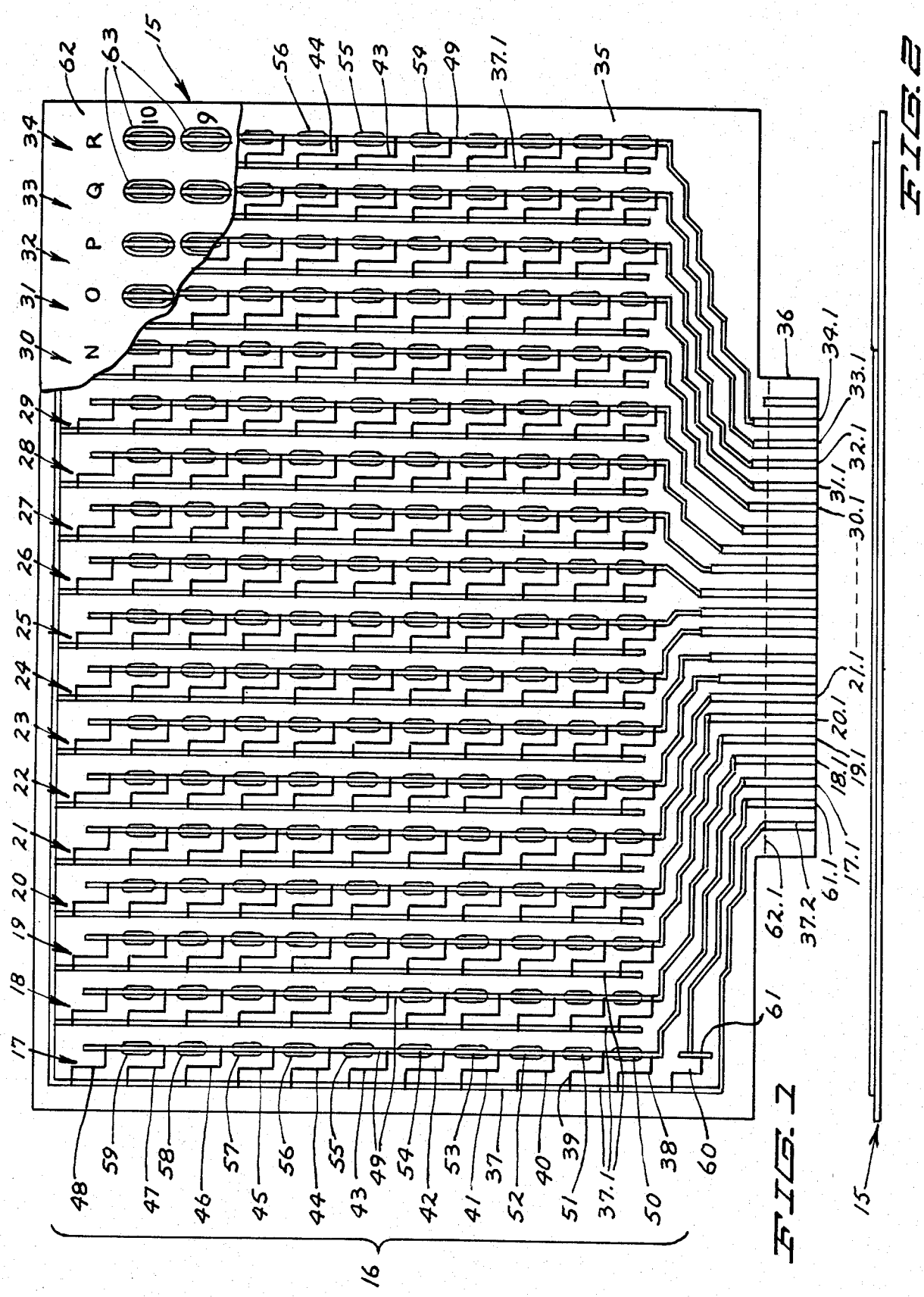

MECHANICALLY PROGRAMMABLE READ ONLY MEMORY

This invention relates to a mechanically programmable read only memory.

BACKGROUND OF THE INVENTION

Programmable memories are useful with logic circuits to institute or control certain functions by control circuits. The number and type of functions that might be controlled are almost limitless.

For instance such functions might include automatic telephone dialing, charging the cost of the call to a particular account, controlling access through entry doors such as into hotel rooms, personal identification of the card holder, supplying tamper-proof information, starting and/or stopping and/or varying the operation of a machine, inducing the taking of certain measurements serving as a supplemental memory, as to modify a fixed memory such as used by a microprocessor and microcomputer, in a control or logic system to provide user modification of performance, and a myriad of other functions.

Previously programmable memories have been, by and large, extremely sophisticated devices. Some are programmable electronically; some are programmable by soldering and welding certain wires and parts or by plugging in conductors for electrical components; some have required assembly of circuit cards on other circuit cards; and some must be programmed during original manufacture.

Among the prior U.S. patents which disclose a number of such memory devices are Brownfield U.S. Pat. No. 3,038,105; Stapper, Jr. U.S. Pat. No. 3,157,857; Cannon U.S. Pat. No. 3,373,406; Garcia U.S. Pat. No. 3,393,449; David U.S. Pat. No. 3,428,954; Lee U.S. Pat. No. 3,492,659; Wallace U.S. Pat. No. 3,504,132; Wallace U.S. Pat. No. 3,560,941; Koo U.S. Pat. No. 3,582,908; Groeger U.S. Pat. No. 3,599,183; Mosman U.S. Pat. No. 3,631,536; and Kohler et al U.S. Pat. No. 3,653,006.

SUMMARY OF THE INVENTION

An object of the invention is to provide a new and improved mechanically programmable read only memory of simple and inexpensive construction and operation.

Another object of the invention is to provide a new and improved mechanically programmable read only memory which is inexpensive, requires no tools or equipment to accomplish programming, may be inexpensively manufactured without regard to maintaining extremely close structural and electrical tolerances, is visually and electrically readable, is tamper resistant, has an extremely large number of readable combinations, and is readable by relatively simple electronic circuitry.

A feature of the invention is an insulating substrate with a multiplicity of resistive coating strips arranged in a pattern on a face of the substrate. A multiplicity of circuit interrupters are provided between corresponding ends of the resistive strips. The circuit interrupters are removable along with any surface media applied thereover. Conductor strips or coating strips are laid over the circuit interrupters and intersect with the ends of the resistive strips for electrical connection therewith. Additional conductor strips or bus strips are applied to intersect with the other ends of the resistive strips.

All of the conductor strips or buses have ends clustered at the edge of the substrate forming connector contacts for assembly with other circuit means.

The resistive strips as well as the conductor strips and certain types of circuit interrupters are inexpensively applied onto the substrate with screen printing technology. The tolerance in total resistance of the several resistive strips, relative to each other, may be easily kept within acceptable limits using such screen printing. Absolute resistance values is not relevant. Such tolerances are preferably in the range of five (5%) percent of the resistance of individual strips.

The circuit interrupters may be applied to the substrate with such screen printing technology. The circuit interrupters may be formed with scratch off ink or mechanically abradable and removable ink, which may be removed by scratching it by a person with his thumb nail, or a coin. Such scratch off ink is well known for its use on lottery tickets, contest game cards, premium coupons and similar devices. A conductor strip applied over an area of the scratch off ink will be removed when the circuit interrupter is scratched off, as to open the circuit.

Another feature of the invention is the multiplicity of sets of resistor matrices wherein each matrix includes a group of resistors arranged in parallel between a common conductor bus and a conductor strip laid over a multiplicity of circuit interrupters each between an adjacent pair of resistor strips. The bus which is common to all the resistor matrices and all of the conductor strips are clustered at one edge of the substrate to establish contact connectors for connection to a decoding circuit. An additional single resistive strip is permanently connected between the bus and its own contact connector.

A protective coating is applied over the substrate and resistive strips and conductor strips, leaving open windows for gaining access to the scratch off circuit interrupters, and also leaving the clustered ends of the conductor strips exposed at the edge of the substrate to define connector contacts.

A particular advantage of the invention is that the programming can be accomplished with a minimum of effort and without any tools or equipment. The memory is read electrically in use, but may be read visually for checking the program. The maintenance of close tolerances in manufacturing the memory is relatively unimportant, as between one memory and the other memories being manufactured, and as between the memories being made in successive batches at different periods of time. Because of the screen printing technology used in making the memories, and combined with the comparative resistors embodied in the memory, the effective tolerances obtained are adequate to obtain the desired operational results.

BRIEF DESCRIPTION OF DRAWINGS

FIG. 1 is a plan view of the memory with significant portions of the protective coating broken away for clarity of detail.

FIG. 2 is an edge elevation view of the memory.

DETAILED DESCRIPTION

Figure 3:
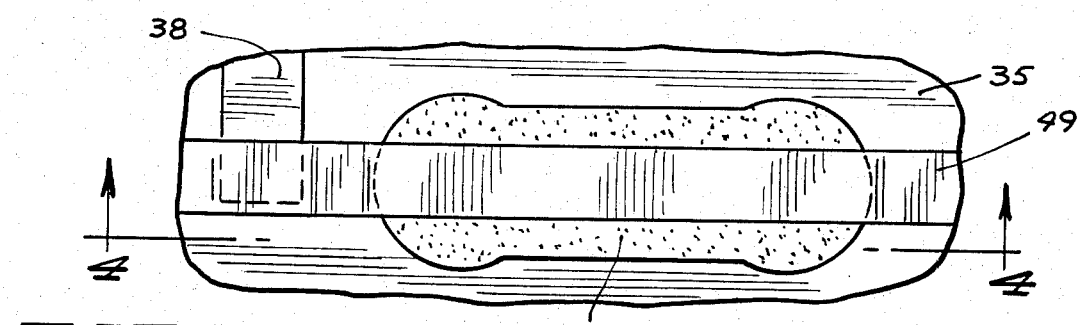
FIG. 3 is a greatly enlarged detail plan view of a portion of the memory.

FIGS. 1 and 2 illustrate the mechanically programmable read only memory which is indicated in general by numeral 15.

The memory 15 is a static device and comprises a set 16 of resistor matrices 17, 18, 19 . . . 34. Each of the matrices 17–34 represent an individual character channel. Each of the matrices 17–34 is substantially identical to all of the other resistor matrices.

The memory 15 includes a substrate or rigid panel 35 of insulating material, and preferably a semi-rigid plastic material. The substrate 35 is typically made of ten mil electrical grade polyester. The substrate 35 is formed with a contact tab 36 protruding from one side edge thereof. The set 16 of resistor matrices includes a conductor bus 37 comprising a conductive strip printed onto the substrate 35 of conductive ink and applied by screen printing technology. The conductive ink used in the bus 37 is of low resistance silver filled ink with an extremely low resistance, typically in the range of 0.03 ohms per square per mil of thickness. The conductor bus 37 will be seen to extend along the perimeter edge of the substrate, at two adjoining sides.

Each of the resistor matrices 17–34 includes a conductor bus strip 37.1 which extends entirely along the length thereof. Each of these bus strips 37.1 is applied to the substrate by screen printing technology and is formed of the same conductive silver filled low resistance ink as the main bus 37.

Each of the resistor matrices 17–34 also includes a plurality or group of like value resistors 38, 39, 40 . . . 48. In the form of memory 15 as illustrated, each of the matrices has eleven such resistors 38–48. Each of the resistors 38–48 intersects with and is electrically connected to the adjacent connector bus strip 37.1. Such resistors 38–48 are applied to the substrate 35 with screen printing technology and are formed of resistive graphite composition filled ink which has a significantly higher resistance than the conductive ink used in the bus 37. Typically, the resistive ink used in the resistors 38–48 in each of the matrices has a resistance of 1.5 k to 2.0 k ohms per square per mil of thickness, or more. The resistance of the resistive ink in the resistors 38–48 has a resistance of at least 1,000 times the resistance in the conductive bus 16.

It will be recognized that the resistors 38–48 are formed in strips with a Z or S shape, as to give the strips a maximum length for the space available. The resistors need not have the shapes illustrated, but may be straight or otherwise configured. All of the resistors in each matrix, and all of the resistors in the entire set 16 of resistor matrices are applied simultaneously and accordingly, the resistors are substantially identical to each other. The actual value of the resistances 38–48 in the set 16 is relatively unimportant, but the tolerance between various resistors in the set 16 should be relatively low, and it is preferred that the resistances be within five percent of each other. The acceptable tolerance relates directly to the number of resistances in each of the matrices 17–34 so that the total resistance in each of the matrices is readily detectable as various numbers of the resistors 38–48 are removed from the circuit.

Each of the resistor matrices 17–34 also includes a printed conductor strip 49 which intersects with and is electrically connected to each of the resistors 38–48. By this circuit arrangement, all of the resistors 38–48 are connected in parallel to each other between the conductor strip 49 and the bus strip 37.1. The conductor strips 37.1 are applied by screen printing technology and of the same identical conductive silver filled ink used in the bus 37 and the bus strips 37.1.

Each of the resistor matrices 17–34 also includes a plurality or group of circuit interrupter means taking the form of circuit interrupters or spots 50–59 of mechanically abradable scratch off ink applied onto the substrate 35 by the same screen printing technology by which all of the other inks are applied. The mechanically abradable scratch off ink used in the circuit interrupters or spots 50–59 is the same type of ink which is commonly used on lottery tickets, contest game cards and merchandise premium coupons. The mechanically abradable ink used in the interrupters or spots 50–59 may be easily removed from the face of the substrate 35 by abrading it with a fingernail of a person's hand, or with the edge of a coin or key or orange stick or the like.

The interrupters or abradable spots 50 of scratch off ink are applied directly to the face of the substrate and between the ends of adjacent resistors 38–48; and the spots 50–59 are arranged to be aligned with and in underlying relation with the conductor strip 49 of the matrices. The conductor strip 49, which overlies the spot 50 of abradable ink, will be removed simultaneously with the spot 50 when the spot is abraded by a person's fingernail, coin or other similar device. As a result, the conductor strip 49 is broken or interrupted at the abraded spot, with the effect that one or more resistors 38–48 are disconnected and are no longer in parallel relation with the remainder of the resistors.

More particularly, it will be recognized that if the spot 59 is abraded, resistor 48 is disconnected; if spot 58 is abraded to open conductor strip 49, then resistors 47 and 48 are disconnected. By abrading spot 50, all of the resistors above spot, along the conductor strip 49, are disconnected, but the one resistor 38 always remains connected between the strip 49 and the bus strip 37.1.

Whereas the interrupter means takes the form of spots 50 of scratch off ink as illustrated, the interrupter means may also take the form of defined areas of the substrate, with shapes comparable to spots 50, which areas may be delaminated or entirely removed to break away portions of the conductor strips 49. Such areas may be defined by perforations or grooves around their peripheries to accommodate delaminating the top face of the substrate 35; or such areas may be simply defined by visible markings if the areas are to be punched out; or such areas may be defined by peel off plastic or paper tabs adhesively secured to the face of the substrate.

Accordingly, it will be seen that each of the resistor matrices 17–34 initially has eleven resistors in parallel with each other; and that resistances of all of the matrices 17–34 are substantially identical with each other. By scratching off one of the spots 50–59 in each of the matrices 17–34, the resistance in each of the matrices is thereby established at a predictable value, within a predetermined tolerance. As a result, each of the matrices has a predetermined predictable characteristic which may be detected.

The memory 15 also includes a reference resistor 60 applied simultaneously with all of the other resistors onto the substrate 35 by the screen printing technology so that the resistor 60 has a known relative value as compared to all of the other resistors 38-48 in all of the matrices. The resistor 60 has one end intersecting and connected with the bus 37; and the other end of resistor 60 intersects and connects with a conductor strip 61 also applied to the substrate with screen printing technology and of the same conductive ink as used in the bus 37.

The conductor strips 49 of each of the resistor matrices 17-34 also extend to the tab 36 at the edge of the substrate 35 as to define connector contacts 17.1, 18.1, 19.1 . . . 34.1 for each of the matrices. The bus 37 also extends into the tab 36 to form a contact connector 37.2 for the bus. The conductor strip 61 associated with the reference resistor 60 also extends into the tab 36 and defines a connector contact 61.1 on the surface of the substrate, adjacent all of the other connector contacts.

The memory also includes a protective coating 62 which overlies the entire face and all of the conductor strips and resistors on the face of the substrate 35 to protect all of the printed strips from unintentional damage. The protective coating may be a plastic lamina or may be a protective coating applied by screen print technology. The protective coating may be any of a broad range of materials including varnish, lacquer, enamel and other synthetic coatings. The protective coating 62 preferably has a multiplicity of windows 63 each exposing a certain one of the circuit interrupters or abradable spots 50-59 of all of the matrices 17-34. The protective coating will thereby not interfere with programming of the memory 15 because the various circuit interrupters or spots can be mechanically abraded or removed to open the conductor strips 49, at the various windows 63. The conductor contacts on the tab 36 remain exposed to facilitate making electrical contact with them through other connectors into which the tab 36 is moved. The edge of the protective coating 62, adjacent the tab 36, is indicated by the dotted line 62.1.

In making the mechanically programmable read only memories 15, a multiplicity of memories will be printed simultaneously on a large sheet of the material forming the insulated substrate 35. The screen printing process is then commenced and the pattern of resistors 38-48 in all of the matrices 17-34, and also the reference resistor 60, are all applied simultaneously. Subsequently, the spots 50 of abradable ink are applied onto the face of the substrate 35 by the same screen printing technology and in the precise locations required. After the resistors and abradable spots have been applied, the conductor pattern including the bus 37, the bus strips 37.1, the conductor strips 49 and all of the conductor contacts or tabs 37.2, 61.1, 17.1, 18.1, 19.1 . . . 34.1 are simultaneously applied by the screen printing technology. Finally the large sheet of material is cut to form a multiplicity of the memories 15.

Because all of the resistances 50-59 and 60 are applied simultaneously, the tolerance between the actual values of these resistors is very low. The conductor strips 37.1 and 49 have an approximate width of 0.030 inches and a thickness of approximately ½ mil to 0.7 mil, and in some instances, up to one mil. The bus strip 37 is slightly wider and may be approximately 1/16th of an inch in width. The connector contacts in the tab 36 have a width of approximately 0.050 inch as to mate properly with contacts in auxiliary appliances into which the memory 15 is placed.

Figure 4:
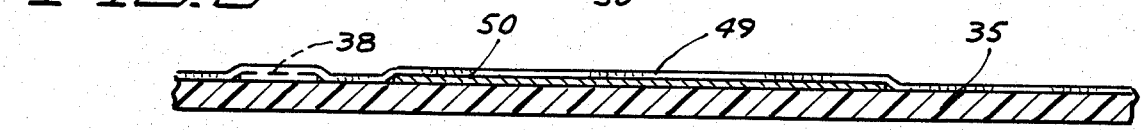
FIG. 4 is a detail section view taken approximately at 4—4 in FIG. 3.
Figure 5:
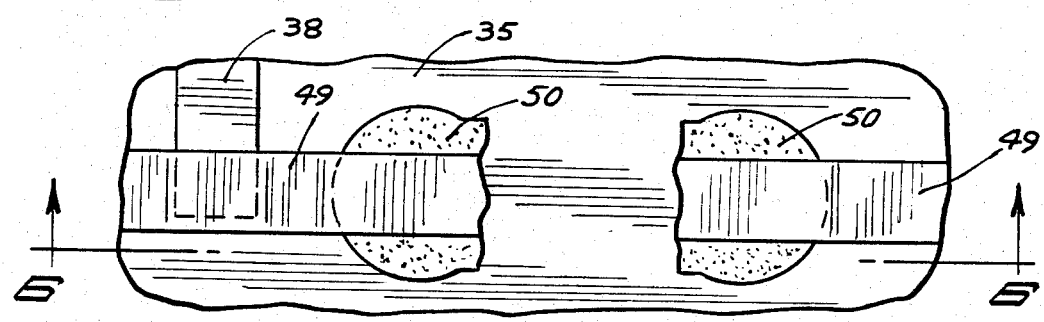
FIG. 5 is a detail plan view similar to FIG. 3, but with a portion of the circuit interrupter removed along with the printed conductor thereon.
Figure 6:
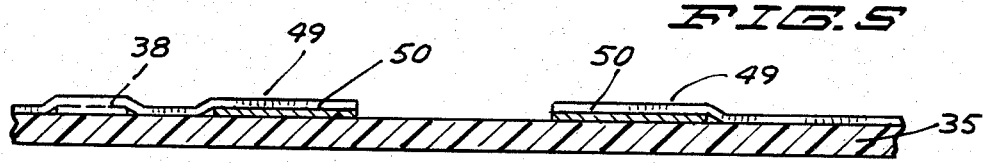
FIG. 6 is a detail section view taken at 6—6 of FIG. 5.
Figure 7:
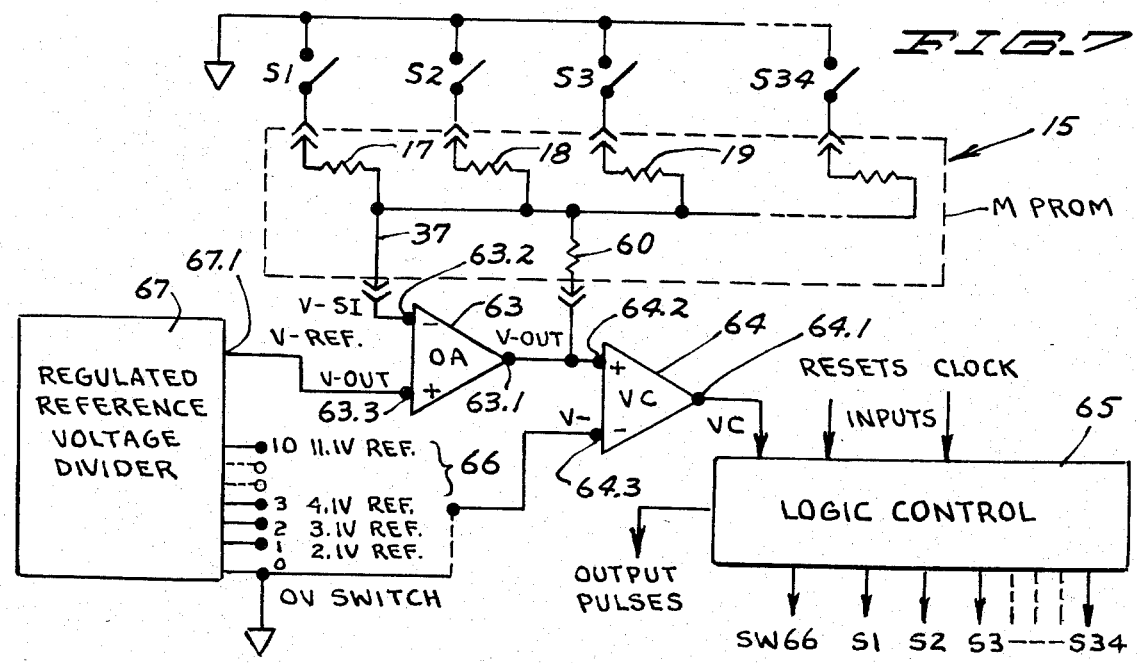
FIG. 7 is a schematic drawing showing the memory in a typical decoding system.

FIGS. 3 and 4 illustrate, in enlarged detail views, the shape and relationships of the abradable spots beneath the conductor strips 49 on the face of the substrate. In FIGS. 5 and 6, the spot has been abraded and the opening of the conductor strip 49 is clearly illustrated.

Reading the value of the several resistor matrices 17-34 is easily accomplished through the use of an operational amplifier 63. The output 63.1 of the operational amplifier is connected through resistor 60 of the memory 15 back to the negative summing junction 63.2 to provide feedback or control of the amplification. One of the most important features of the operational amplifier 63 is the maintaining of the negative summing junction 63.2 at the same voltage as the positive summing junction 63.3. The amplifier 63 will drive the voltage at the output 63.1 to equal the voltage at the positive summing junction 63.3.

The voltages at the operational amplifier 63 are designated $V_{OUT}$ at the output 63.1; $V_{IN}$ at the positive summing junction input 63.3; and $V_{-SJ}$ at the negative summing junction 63.2. With the switch S1 closed, and recognizing that $V_{IN} = V_{-SJ}$, the following relationships may be written to establish $V_{OUT}$.

$$V_{-SJ} = \frac{R_{17}}{R_{17} + R_{60}} \times V_{OUT} \qquad (a)$$

$$V_{OUT} = \frac{R_{17} + R_{60}}{R_{17}} \times V_{-SJ} \qquad (b)$$

$$V_{OUT} = \frac{R_{17} + R_{60}}{R_{17}} \times V_{IN} \qquad (c)$$

$R_{17}$ is the resistance value of resistor matrix 17 and $R_{60}$ is the resistance value of resistor 60. The output $V_{OUT}$ from the operational amplifier 63 depends upon the amount of resistance between the output 63.1 and ground, or the equivalent resistance of resistor 60 and the resistor matrix 17. Using the formula above, if only resistor 38 remains in the circuit along with resistor 60, then $V_{OUT}$ is two times $V_{IN}$. If two resistors 38 and 39 remain in the matrix 17, then $R_{17}$ is half of $R_{60}$ and $V_{OUT}$ will be three times $V_{IN}$. If three resistors 38, 39 and 40 remain in matrix 17, then $R_{17}$ is one-third of $R_{60}$, and $V_{OUT}$ will be four times $V_{IN}$. It will be seen therefore that $V_{OUT}$ is equal to $V_{IN}$ multiplied by the number of resistors remaining in the matrix plus one.

The measurement of $V_{OUT}$ and the number of resistors remaining in the matrix 17 will be seen to depend only on the relative ohmic value of the resistances remaining in the matrix and the reference resistor 60, and not upon the actual ohmic value of the resistors.

Accordingly, it is concluded that the resistance value of a matrix in the mechanically programmable read only memory is read in analog terms, or levels of voltage, by the operational amplifier 63.

In order to convert these voltage levels, $V_{OUT}$, into discrete or separate signals, a voltage comparator 64 is utilized. The voltage comparator 64 needs no feedback resistors and its output responds to the difference in voltage at its inputs. The output voltage $V_C$ at 64.1 will remain at zero so long as the voltage $V_-$ at the negative or "−" input 64.3 is larger than the voltage at the positive or "+" input 64.2. If the voltage $V_{OUT}$ at the positive input 64.2 is raised above the voltage $V_-$ at the negative input 64.3, then the output voltage at 64.1 becomes positive; and the output voltage $V_C$ at 64.1 may increase to approximately the supply voltage of the amplifier. The output of the voltage comparator 64 is compatible with digital electronic circuitry and is widely used for interfacing between analog and digital circuits.

The logic circuit 65 generates a number of output pulses which corresponds to the number of resistors effectively remaining in matrix 17, then in matrix 18, and sequentially matrices 19, 20 . . . 34. The logic control 65 will first close switch S1 to determine and indicate the number of resistors in matrix 17. Then switch S1 is opened and switch S2 is closed by the logic control 65 which determines and indicates the number of resistors in matrix 18. The remaining matrices of the memory 15 are then analyzed, and progressively, the logic control indicates the number of resistors in each of the matrices 19–34 as switches S3–S34 are sequentially closed. As each matrix is being analyzed, the number of output pulses generated will correspond to the number of resistors in the matrix and as an indication of the program for that particular matrix.

The logic control progressively operates electronic switches S1, S2, S3 . . . S34, closing them one at a time and then opening each switch immediately prior to closing the next switch. In this way, the corresponding matrices 17–34 in the memory 15 are progressively connected for analyzing.

The logic control also operates electronic switch 66, effectively connecting, progressively, to each of the eleven contacts 0 through 10, and then resetting to contact 0. More specifically, the electronic switch 66, progressively connects the contacts, starting with 0, and moving stepwise to each successive contact until a contact is found with a voltage that exceeds $V_{OUT}$, whereupon, voltage $V_C$ at the output 64.1 of the voltage comparator 64 drops to zero. When $V_C$ drops to zero, the logic control 65 resets switch 66 to position or contact 0, discontinues production of output pulses representative of that resistor matrix, opens one of switches S1–S34 and closes the next switch S1–S34, so as to connect in the next resistor matrix.

The clock of the logic control 65 initiates production of the output pulses which is also coordinated with the progressive operation of electronic switch 66. Accordingly, the analog output $V_{OUT}$ of the operational amplifier 63 is converted to a digital output in the number of output pulses produced which is the same as the number of resistors connected in the resistor matrix being analyzed.

If all eleven resistors 38–48 in matrix 17 remain, the switch 66 will move through eleven positions without finding a voltage that exceeds $V_{OUT}$ at 63.1, and eleven output pulses will be generated.

In analyzing the next matrix 18 after closing switch S2 on the next clock pulse, if interrupter 59 of matrix 18 is scratched out, leaving only ten resistors in the matrix, $V_{OUT}$ equals $V_{REF} \times (10+1)$. Then the switch 66 will step through ten positions to position 10 to apply voltage of 11.1 $V_{REF}$ to input 64.3 of comparator 64, whereupon the output voltage $V_C$ of the voltage comparator drops to zero, thus allowing the generation of ten output pulses to indicate the number of resistors remaining in matrix 18. This same process is progressively repeated until all matrices 19–34 have also been read.

More specifically, with respect to the analysis of the matrices, the regulated reference voltage divider 67 establishes a fixed reference voltage $V_{REF}$ at 67.1, which is continuously applied at 63.3 as $V_{IN}$ to the operational amplifier 63. The voltage divider 67 also establishes fixed voltages 2.1 times $V_{REF}$ at contact 1; 3.1 $V_{REF}$ at contact 2; 4.1 $V_{REF}$ at contact 3, . . . , and 11.1 $V_{REF}$ at contact 10. These are to be compared against $V_{OUT}$ of operational amplifier 63 at 63.1, which is the same as the input voltage $V_+$ at 64.2 of the voltage comparator.

As indicated previously, the operational amplifier 63 maintains $V_{IN}$ at 63.3 to be equal to $V_{-SJ}$ at 63.2; and $V_{OUT}$ at 63.1 will vary according to the equation (c) indicated above; and also $$V_{OUT} = V_{IN} \times (\text{No. of resistors in the matrix} + 1)$$

or $$V_{OUT} = V_{REF} \times (\text{No. of resistors in the matrix} + 1)$$

Accordingly, when the matrix contains all eleven resistors 38–48, then $V_{OUT}$ equals 12 $V_{REF}$. If the matrix contains 10 resistors 38–47, then $V_{OUT}$ equals 11 $V_{REF}$; and so on; and if the matrix contains only one resistor 38 (interrupter 50 being scratched off to open conductor 37.1), then $V_{OUT}$ equals 2 $V_{REF}$.

It now becomes apparent that when any one of switches S1–S34 is closed, the clock pulses cause simultaneous generation of output pulses and generation of stepped operation of switch 66, for so many clock pulses until one of the contacts 1–10 of voltage divider 67 is connected to input 64.3 of comparator 64 which exceeds the voltage $V_{OUT}$ at 64.2, whereupon the voltage $V_C$ at 64.1 drops to zero, causing output pulses to cease and also causing the electronic switch 66 to reset, and also causes the one matrix to be switched out of the circuit and the next matrix to be connected for analysis.

What is claimed is:

1. A mechanically programmable read only memory for use with reading circuitry and comprising,
    an insulating substrate having a face and an edge portion,
    circuit interrupter means including a removable support area on the substrate,
    a plurality of resistors on the substrate adjacent the circuit interrupter, each of the resistors having first and second connection ends,
    a conductor bus on the substrate and having a connector portion, the bus having connection with the first ends of said resistors, and
    a printed conductor on the substrate and traversing said support area, the printed conductor having spaced portions on opposite sides of the support area and respectively connected with the second ends of a pair of the resistors, the printed conductor having a connection portion adjacent one of the resistors, and the printed conductor being opened and disconnected with removal of said support area for disconnecting one of said resistors.

2. A memory according to claim 1 and a protective covering on the substrate and adhering thereto.

3. A memory according to claim 2 wherein said protective covering has windows therein through which said removable support area is exposed.

4. A memory according to claim 1 and said resistors being printed on the substrate and being substantially S-shaped.

5. A memory according to claim 1 wherein all of the resistors are of equal value.

6. A memory according to claim 1 and the bus and conductor having clustered ends at the edge portion of the substrate for connecting with said reading circuitry.

7. A memory according to claim 1 wherein said removable support area comprises a spot of scratch off ink underlying the printed conductor to facilitate severing and opening the printed conductor.

8. A memory according to claim 1 and said circuit interrupter means is a portion of the substrate defining said removable area and denoted by an indicator means, a length of the conductor traversing the area and being removable therewith.

9. A memory according to claim 1 and a reference conductor printed on the substrate, and an additional reference resistor on the substrate and having connection with the bus and third conductor.

10. A mechanically programmable read only memory for use with reading circuitry comprising,
   an insulating substrate having a face and a side portion,
   a printed resistor matrix on the substrate and including a plurality of printed strip resistors spaced from each other in a regular pattern on the substrate, the matrix including circuit interrupter means including a plurality of removable areas on the substrate adjacent the resistors, the matrix also including a printed strip conductor on the substrate and having intersection with each of the resistors, and the strip conductor traversing one of the removable areas between adjacent intersections of a pair of said resistors,
   a printed strip conductor bus on the substrate and intersecting all of the strip resistors, and
   the conductor bus and the strip conductor having ends clustered at one side portion of the substrate for connection to said reading circuitry.

11. A memory according to claim 10 and said removable areas of the circuit interrupter means comprising spots of scratch off ink traversed by said strip conductors to open the strip conductor and change the detectable resistance between the strip conductor and the conductor bus.

12. A memory according to claim 10 and a reference conductor on the substrate with a portion extending to said side portion of the substrate, and a reference resistor on the substrate and between said bus and said reference conductor.

13. A memory according to claim 10 and a protective covering overlying the substrate and adhered thereto and having a multiplicity of windows exposing said removable areas to permit removal thereof.

14. A memory according to claim 10 and all of said resistors in the matrix being of equal value.

15. A mechanically programmable read only memory for use with reading circuitry comprising,
   an insulating substrate having a face and side portions,
   a set of printed resistor matrices on the substrate, each of the resistor matrices including a plurality of printed strip resistors spaced from each other in a regular pattern on the substrate, each of the resistor matrices including a circuit interrupter means including a plurality of removable areas on the substrate and adjacent the resistors in the matrix, and each of the resistor matrices also including a printed strip conductor on the substrate and having intersection with each of the printed resistors, and each strip conductor also traversing one of the removable areas in the matrix between adjacent intersections with the resistors, the strip conductors being opened upon removal of said areas,
   a printed reference resistor on the substrate and adjacent the resistor matrices, a printed strip conductor bus on the substrate and intersecting all of the strip resistors,
   a printed reference conductor connected with the reference resistor,
   the strip conductors, conductor bus and reference conductor having clustered ends at one side portion of the circuitry for connection with said reading circuitry.

16. A memory according to claim 15 and said conductor bus and strip conductors lying parallel to each other, the strip resistors in each of the matrices being substantially S-shaped and of equal value relative to each other.

17. A mechanically programmable read only memory for use with reading circuitry comprising,
   an insulating substrate having a face and side portions,
   a set of multiple component matrices on the face of the substrate, each of said matrices including a multiplicity of individually identifiable circuit component means in an array to operate singularly and in varying numbers with each other to produce detectable electrical influences indicative of the number of such component means as may be operating, including a mechanically severable conductor means adhered on the substrate and having connection with each of said circuit component means in the array, the conductor means of each of the matrices also traversing and adhering to one of the removable areas between adjacent connections with said circuit component means, the removal of said areas severing said conductor means and thereby rendering the corresponding circuit component means inoperable,
   conductor bus means on the substrate and connected with the circuit component means of the several matrices,
   the bus means and conductor means having connector portions clustered on the substrate for connection with such reading circuitry.

18. A memory according to claim 17 wherein said removable areas of the mechanically severable conductor means comprise spots of scratch off ink over which the conductor means traverse.

19. A memory according to claim 18 and including reference circuit component means on the substrate and having connection between the bus means and a reference conductor printed on the substrate and extending to the side portion for providing a connector.

* * * * *